US 6,709,316 B1

(12) United States Patent
Sun et al.

(10) Patent No.: US 6,709,316 B1
(45) Date of Patent: Mar. 23, 2004

(54) METHOD AND APPARATUS FOR TWO-STEP BARRIER LAYER POLISHING

(75) Inventors: Lizhong Sun, San Jose, CA (US); Stan Tsai, Fremont, CA (US); Shijian Li, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 296 days.

(21) Appl. No.: 09/698,864

(22) Filed: Oct. 27, 2000

(51) Int. Cl.[7] .................................................. B24B 7/00
(52) U.S. Cl. ............................ 451/41; 451/36; 451/57; 438/692; 438/693; 156/345.11; 156/345.12
(58) Field of Search ............................. 451/41, 36, 57, 451/63; 438/690, 691, 692, 693; 156/345.11, 345.12

(56) References Cited

U.S. PATENT DOCUMENTS

| | | | |
|---|---|---|---|
| 4,920,031 A | 4/1990 | Ohno et al. ................. 430/522 |
| 5,340,370 A | 8/1994 | Cadien et al. ................. 51/308 |
| 5,676,587 A | 10/1997 | Landers et al. ................ 451/57 |
| 5,693,563 A | 12/1997 | Teong ........................ 437/190 |
| 5,735,963 A | 4/1998 | Obeng .......................... 134/3 |
| 5,783,489 A | 7/1998 | Kaufman et al. ............. 438/692 |
| 5,842,910 A | 12/1998 | Krywanczyk et al. ......... 451/41 |
| 5,893,796 A | 4/1999 | Birang et al. ................ 451/526 |
| 5,954,997 A | 9/1999 | Kaufman et al. ........... 252/79.1 |
| 5,985,748 A | 11/1999 | Watts et al. ................. 438/622 |
| 6,001,730 A | 12/1999 | Farkas et al. ............... 438/627 |
| 6,074,949 A | 6/2000 | Schonauer et al. .......... 438/692 |
| 6,083,840 A | 7/2000 | Mravic ....................... 438/693 |
| 6,117,775 A | 9/2000 | Kondo et al. ............... 438/690 |
| 6,136,714 A | 10/2000 | Schutz ....................... 438/692 |
| 6,143,656 A | 11/2000 | Yang et al. .................. 438/687 |
| 6,156,661 A | 12/2000 | Small ......................... 438/662 |
| 6,183,686 B1 | 2/2001 | Bardus et al. .................. 419/8 |
| 6,218,290 B1 | 4/2001 | Schonauer et al. .......... 438/633 |
| 6,238,592 B1 * | 5/2001 | Hardy et al. ................ 438/691 |
| 6,258,721 B1 | 7/2001 | Li et al. ..................... 438/693 |
| 6,271,416 B1 | 8/2001 | Takagaki et al. ............. 562/433 |
| 6,375,559 B1 | 4/2002 | James et al. ................. 451/527 |
| 6,409,781 B1 * | 6/2002 | Wojtczak et al. .............. 51/308 |
| 6,417,087 B1 * | 7/2002 | Chittipeddi et al. ......... 438/612 |

FOREIGN PATENT DOCUMENTS

| | | | |
|---|---|---|---|
| EP | 1 006 166 A1 | 6/2000 | ............ C09G/1/02 |
| EP | 1 011 131 | 6/2000 | ......... H01L/21/321 |
| EP | 1 085 067 | 3/2001 | ............ C09G/1/02 |
| WO | WO 98/04646 | 2/1998 | ........... C09K/13/00 |
| WO | WO 98/36045 | 8/1998 | ............ C11D/3/18 |
| WO | 98/41671 | 9/1998 | ............ C23F/1/14 |
| WO | WO 00/00561 | 1/2000 | ............ C09G/1/02 |
| WO | WO 00/24842 | 5/2000 | ............ C09K/3/14 |

OTHER PUBLICATIONS

US 5,985,755, 11/1999, Bajaj et al. (withdrawn)
PCT International Search Report from International Application No. PCT/US01/50150, Dated Sep. 23, 2002.
USSN 09/569,968 filed May 11, 2000 (Sun, et al.).
USSN 09/968,863 filed Oct. 27, 2000 (Tsai, et al.).
USSN 09/755,717 filed Jan. 5, 2001 (Sun, et al.).
USSN 10/187,857 filed Jun. 27, 2002 (Tsai, et al.).
USSN 10/193,810 filed Jul. 11, 2002 (Tsai, et al.).
USSN 10/215,521 filed Aug. 8, 2002 (Sun, et al.).
International Search Report for PCT/US02/00062, dated Jul. 8, 2002.

* cited by examiner

Primary Examiner—Eileen P. Morgan
(74) Attorney, Agent, or Firm—Moser, Patterson & Sheridan

(57) ABSTRACT

A method and composition for planarizing a substrate surface having a barrier layer disposed thereon. In one aspect, the invention provides for planarizing a substrate surface having a barrier layer and a copper containing material disposed thereon including chemical mechanical polishing the substrate to selectively remove excess copper containing material, chemical mechanical polishing the substrate to selectively remove residual copper containing material and a portion of the barrier layer, and chemical mechanical polishing the substrate to selectively remove residual barrier layer.

55 Claims, 3 Drawing Sheets

METHOD AND APPARATUS FOR TWO-STEP BARRIER LAYER POLISHING

BACKGROUND OF THE INVENTION

1. Field of the Invention

The present invention relates generally to the fabrication of semiconductor devices and to chemical mechanical polishing and planarization of semiconductor devices.

2. Background of the Related Art

Reliably producing sub-half micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology has placed additional demands on the processing capabilities. The multilevel interconnects that lie at the heart of this technology require precise processing of high aspect ratio features, such as vias, contacts, lines, and other interconnects. Reliable formation of these interconnects is important to VLSI and ULSI success and to the continued effort to increase circuit density and quality of individual substrates and die.

In order to further improve the current density of semiconductor devices on integrated circuits, it has become necessary to use conductive materials having low resistivity for conductors and materials having low dielectric constant (low k, defined herein as having dielectric constants, k, less than about 4.0) as insulating layers to reduce the capacitive coupling between adjacent interconnects. Increased capacitative coupling between layers can detrimentally affect the functioning of semiconductor devices.

One conductive material gaining acceptance is copper and its alloys, which have become the materials of choice for sub-quarter-micron interconnect technology because copper has a lower resistivity than aluminum, (1.7 $\mu\Omega$-cm compared to 3.1 $\mu\Omega$-cm for aluminum), and a higher current carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, i.e. vias, and horizontal interconnects, i.e., lines. Conductive materials, such as copper, and other materials, such as barrier layer materials used to prevent diffusion of conductive material into the surrounding low k dielectric, are then inlaid into the etched pattern. Any excess conductive material and excess barrier layer material external to the etched pattern, such as on the field of the substrate, is then removed.

Barrier layer materials include, for example, tantalum (Ta), tantalum nitride (TaN), titanium (Ti), and titanium nitride.

As layers of materials are sequentially deposited and removed, the uppermost surface of the substrate may become non-planar across its surface and require planarization. Planarizing a surface, or "polishing" a surface, is a process where material is removed from the surface of the substrate to form a generally even, planar surface. Planarization is useful in damascene processes to remove excess deposited material and to provide an even surface for subsequent levels of metallization and processing. Planarization may also be used in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing pad in a CMP apparatus. The carrier assembly provides a controllable pressure to the substrate urging the substrate against the polishing pad. The pad is moved relative to the substrate by an external driving force. Thus, the CMP apparatus effects polishing or rubbing movement between the surface of the substrate and the polishing pad while dispersing a polishing composition to effect both chemical activity and mechanical activity.

Conventionally, in polishing copper features, such as a dual damascenes, the copper material is polished to the barrier layer, and then the barrier layer is polished to the underlying dielectric layer. One challenge which is presented in copper polishing is that the interface between copper and the barrier layer is generally non-planar. Further, the copper material and the barrier materials are often removed from the substrate surface at different rates. These challenges in copper removal often results in the retention of copper containing material, or residue, on the surface of the substrate. To ensure removal of all the copper material and residue before removing the barrier material, it is necessary to overpolish the copper and the interface. Overpolishing of copper and the interface can result in forming topographical defects, such as concavities or depressions, referred to as dishing, and can further lead to non-uniform removal of the barrier layer disposed thereunder.

FIG. 5 is a schematic view of a substrate illustrating the phenomenon of dishing. Conductive lines 211 and 212 are formed by depositing conductive material, such as copper or copper alloy, in a feature definition formed in the dielectric layer 210, typically comprised of silicon oxides or other dielectric materials. After planarization, for example, a portion of the conductive material is depressed by an amount D, referred to as the amount of dishing, forming a concave copper surface. Dishing results in a non-planar surface that impairs the ability to print high resolution lines during subsequent photolithographic steps and detrimentally affects subsequent surface topography of the substrate and device formation. Dishing also detrimentally affects the performance of devices by lowering the conductance and increasing the resistance of the devices, contrary to the benefit of using higher conductive materials, such as copper.

Therefore, there exists a need for a method and related CMP composition which facilitates the removal of copper containing material residue and the barrier layer, and provides selectivity therebetween and to the underlying dielectric layer.

SUMMARY OF THE INVENTION

The invention generally provides a method and composition for planarizing a substrate surface having a barrier layer disposed thereon. In one aspect, the invention provides for planarizing a substrate surface, comprising providing a substrate comprising a dielectric layer with feature definitions formed therein, a barrier layer conformally deposited on the dielectric layer and in the feature definitions formed therein, and a copper containing material deposited on the barrier layer and filling the feature definitions formed therein, chemical mechanical polishing the substrate with a bulk CMP composition to substantially remove excess copper containing materials, chemical mechanical polishing the substrate with a first CMP composition to remove residual copper containing materials and at least a portion of the barrier layer, and chemical mechanical polishing the substrate with a second CMP composition to selectively remove residual barrier layer.

In another aspect, the invention provides a method for planarizing a substrate surface, comprising providing a substrate comprising a dielectric layer with feature definitions formed therein, a barrier layer conformally deposited on the dielectric layer and in the feature definitions formed therein, and a copper containing material deposited on the barrier layer and filling the feature definitions formed therein, supplying a bulk polishing composition to the substrate, removing substantially excess copper containing material at a ratio of copper containing material to barrier layer between about 1:0 and about 1:0.01 by a polishing technique, supplying a first polishing composition to the substrate, removing residual copper containing materials and removing a portion of the barrier layer from the substrate at a ratio of copper containing material to barrier layer between about 2:1 and about 1:1 by a polishing technique, supplying a second polishing composition to the substrate, and removing residual barrier layer from the surface of the substrate at a ratio of barrier layer to copper containing material to dielectric layer between about 1:0:0 and about 1:0.2:0.2 by a chemical mechanical polishing technique.

Another aspect of the invention provides a method for planarizing a barrier layer comprising a tantalum containing material on a substrate surface, comprising chemical mechanical polishing the substrate to selectively remove residual copper containing material and a portion of the tantalum containing material therefrom, and then chemical mechanical polishing the substrate to selectively remove residual tantalum containing material therefrom.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In general, aspects of the invention provide a method and polishing composition for removing conductive material and barrier layer materials while eliminating or substantially reducing dishing. The invention will be described below in reference to the removal of copper and tantalum/tantalum nitride barrier layers from a substrate surface by a chemical mechanical polishing (CMP) technique. CMP is broadly defined herein as polishing a substrate by chemical activity, mechanical activity, or a combination of both chemical and mechanical activity.

One apparatus for performing the planarizing process and composition described herein is a Mirra® CMP System available from Applied Materials, Inc., as shown and described in U.S. Pat. No. 5,738,574, entitled, "Continuous Processing System for Chemical Mechanical Polishing," the entirety of which is incorporated herein by reference to the extent not inconsistent with the invention. Although, the CMP process and composition is illustrated utilizing the Mirra® CMP System, any system enabling chemical mechanical polishing using the composition described herein can be used to advantage. Examples of other suitable polishing apparatus include the Obsidian 8200C System available from Applied Materials, Inc., or a linear polishing system, using a sliding or circulating polishing belt or similar device. An example of a linear polishing system is more fully described in co-pending U.S. patent application Ser. No. 09/244,456, filed on Feb. 4, 1999, and incorporated herein by reference to the extent not inconsistent with the invention. The following apparatus description is illustrative and should not be construed or interpreted as limiting the scope of the invention.

Figure 1:
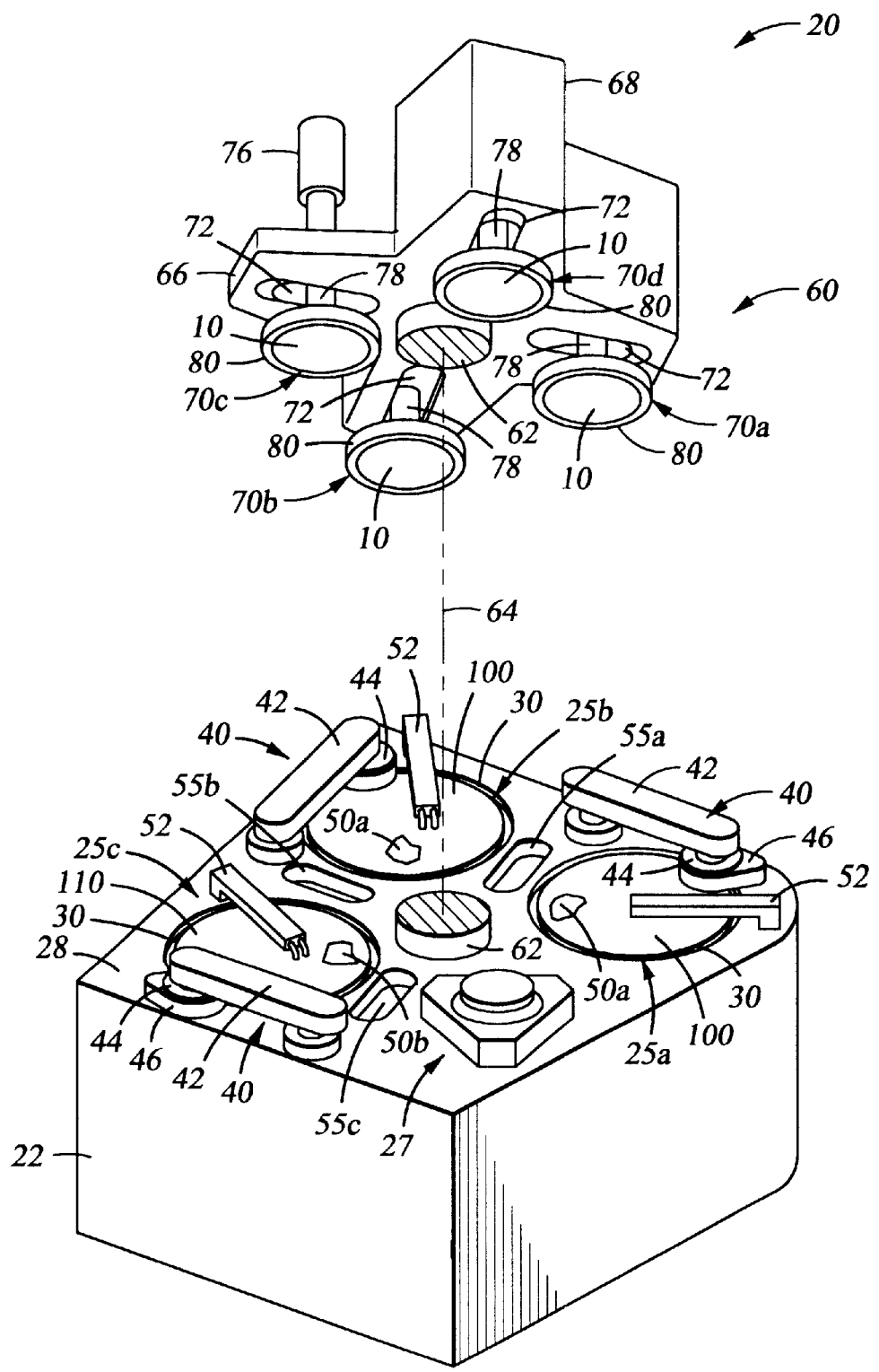
FIG. 1 is a schematic perspective view of a chemical mechanical polishing apparatus.

FIG. 1 is a schematic perspective view of a chemical mechanical polishing apparatus 20. The polishing apparatus 20 includes a lower machine base 22 with a table top 28 mounted thereon and a removable outer cover (not shown). The table top 28 supports a series of polishing stations, including a first polishing station 25a, a second polishing station 25b, a final polishing station 25c, and a transfer station 27. The transfer station 27 serves multiple functions, including, for example, receiving individual substrates 10 from a loading apparatus (not shown), washing the substrates, loading the substrates into carrier heads 80, receiving the substrates 10 from the carrier heads 80, washing the substrates 10 again, and transferring the substrates 10 back to the loading apparatus.

Each polishing station 25a–25c includes a rotatable platen 30 having a polishing pad 100 or 110 disposed thereon. Each platen 30 may be a rotatable aluminum or stainless steel plate connected to a platen drive motor (not shown). The polishing stations 25a–25c may include a pad conditioner apparatus 40. The pad conditioner apparatus 40 has a rotatable arm 42 holding an independently rotating conditioner head 44 and an associated washing basin 46. The pad conditioner apparatus 40 maintains the condition of the polishing pad so that it will effectively polish the substrates. Each polishing station may include a conditioning station if the CMP apparatus is used with other pad configurations.

The polishing stations 25a–25c may each have a slurry/rinse arm 52 that includes two or more supply tubes to provide one or more chemical slurries and/or water to the surface of the polishing pad. The slurry/rinse arm 52 delivers the one or more chemical slurries in amounts sufficient to cover and wet the entire polishing pad. Each slurry/rinse arm 52 also includes several spray nozzles (not shown) that can provide a high-pressure fluid rinse on to the polishing pad at the end of each polishing and conditioning cycle. Furthermore, two or more intermediate washing stations 55a, 55b, and 55c may be positioned between adjacent polishing stations 25a, 25b, and 25c to clean the substrate as it passes from one station to the next.

A rotatable multi-head carousel 60 is positioned above the lower machine base 22.

The carousel 60 includes four carrier head systems 70a, 70b, 70c, and 70d. Three of the carrier head systems receive or hold the substrates 10 by pressing them against the polishing pads 100 or 110 disposed on the polishing stations 25a–25c. One of the carrier head systems 70a–70d receives a substrate from and delivers a substrate 10 to the transfer station 27. The carousel 60 is supported by a center post 62 and is rotated about a carousel axis 64 by a motor assembly (not shown) located within the machine base 22. The center post 62 also supports a carousel support plate 66 and a cover 68.

The four carrier head systems 70a–70d are mounted on the carousel support plate 66 at equal angular intervals about the carousel axis 64. The center post 62 allows the carousel motor to rotate the carousel support plate 66 and orbit the carrier head systems 70a–70d about the carousel axis 64. Each carrier head system 70a–70d includes one carrier head 80. A carrier drive shaft 78 connects a carrier head rotation motor 76 (shown by the removal of one quarter of the cover 68) to the carrier head 80 so that the carrier head 80 can independently rotate about its own axis. There is one carrier drive shaft 78 and motor 76 for each head 80. In addition, each carrier head 80 independently oscillates laterally in a radial slot 72 formed in the carousel support plate 66.

The carrier head 80 performs several mechanical functions. Generally, the carrier head 80 holds the substrate 10 against the polishing pad 100 or 110, evenly distributes a downward pressure across the back surface of the substrate 10, transfers torque from the drive shaft 78 to the substrate 10, and ensures that the substrate 10 does not slip out from beneath the carrier head 80 during polishing operations.

Chemical Mechanical Polishing Process and Composition

CMP is broadly defined herein as polishing a substrate by chemical activity, mechanical activity, or a combination of both chemical and mechanical activity. In some systems, a substrate is polished on a pad in the presence of a polishing fluid, also known as a slurry, which may contain chemicals that pacify or oxidize the layer being polished and abrasives that abrasively remove or polish off the surface of the layer. The interaction of a polishing pad, the chemically reactive polishing fluid, and the abrasive polishing fluid with the surface of the substrate imparts a combination of chemical and mechanical forces to the substrate which planarizes the substrate surface and results in controlled polishing of the exposed layer. In a fixed-abrasive system, a polishing pad called a fixed abrasive pad is used which does not require abrasive particles within the slurry. Typically, a polishing fluid without abrasive particles is used in concert with the fixed abrasive pad to provide the chemical component of the polishing process.

A substrate surface processed by the methods and compositions described herein generally comprises a dielectric layer with feature definitions formed therein, a barrier layer deposited on the dielectric layer, and a copper containing material deposited on the barrier layer. The copper containing material includes copper, copper alloys, or doped copper. As used throughout this disclosure, the phrase "copper containing material" and the symbol Cu are intended to encompass high purity elemental copper as well as doped copper, e.g. phosphorous doped copper and copper-based alloys, e.g., copper-based alloys containing at least about 80 wt. % copper. The barrier layer material includes tantalum-containing materials, such as tantalum, tantalum nitride, or tantalum silicon nitride. Other barrier materials conventionally used in the art for aluminum, copper, and tungsten metallization processes are also contemplated by the invention.

The dielectric layer can comprise any of various dielectric materials conventionally employed in the manufacture of semiconductor devices. For example, dielectric materials, such as silicon dioxide, phosphorus-doped silicon glass (PSG), boron-phosphorus-doped silicon glass (BPSG), and silicon dioxide derived from tetraethyl orthosilicate (TEOS) or silane by plasma enhanced chemical vapor deposition (PECVD) can be employed. The dielectric layer can also comprise low dielectric constant materials, including fluoro-silicon glass (FSG), polymers, such as polyamides, and carbon-containing silicon dioxide, such as Black Diamond™, commercially available from Applied Materials, Inc., of Santa Clara, Calif. The openings are formed in interlayer dielectrics by conventional photolithographic and etching techniques.

In one embodiment of the invention, a two step planarizing process for removing copper containing residues and barrier layer materials from a substrate surface following bulk removal of excess copper containing material disposed thereon is provided. In the first step, a first composition is used to selectively remove residual copper containing material remaining from the bulk removal process and at least a portion of the underlying barrier layer material. A second composition selectively removes residual barrier layer material, which advantageously stops on an underlying dielectric layer, thereby planarizing the surface of the substrate.

The bulk of the copper containing material can be selectively removed using a CMP composition comprising one or more chelating agents, one or more oxidizers, one or more corrosion inhibitors, and deionized water. The CMP composition may also further include one or more pH adjusting agents and/or abrasive particles. The CMP composition is well suited for removing copper from the substrate described above with minimal removal of the barrier layer material. Copper can be selectively removed at a ratio between about 1:0 and about 1:0.2 of copper to barrier material. Selectivity is defined broadly herein as the rate of removal of one material in comparison to the rate of removal of a second or additional materials in a CMP process. Selective to a "material" is broadly defined herein as removing the material at an equal or higher rate than other materials or adjacent materials in a CMP process.

In the bulk CMP composition, the one or more chelating agents may include one or more amine or amide groups, such as ethylenediaminetetraacetic acid, ethylenediamine or methylformamide. The one or more chelating agents can be present in an amount between about 0.2 vol % to about 3.0 vol % of the CMP composition. The oxidizers can be any of various conventional oxidizers employed in CMP compositions and processes, such as hydrogen peroxide, ferric nitride, or other compounds such as iodates. The oxidizers can be present in an amount between about 0.5 vol % and about 8.0 vol % of the CMP composition. Examples of corrosion inhibitors include any of various organic compounds containing an azole group, such as benzotriazole, mercaptobenzotriazole, or 5-methyl-1-benzotriazole. The corrosion inhibitors can be present in an amount between about 0.02 vol % and about 1.0 vol % of the CMP composition.

The pH adjusting agent or agents can be present in an amount sufficient to adjust the pH of the CMP composition to a range of about 2.5 to about 11 and can comprise any of various bases, such as potassium hydroxide (KOH), or inorganic and/or organic acids, such as acetic acid, phosphoric acid, or oxalic acid. The pH is adjusted based on the composition of the various components of the composition, for example if hydroxylamine is used as the reducing agent, potassium hydroxide is added to the composition to produce an alkaline pH, i.e., between a pH of about 7 and about 10.

The bulk CMP composition may further comprise up to about 35 wt. % of abrasive particles, such as silica. Other chelating agents, oxidizers, corrosion inhibitors, and pH adjusting agents are contemplated for use with the invention. The above-specified components are illustrative and should not be construed as limiting the invention. The bulk CMP composition is more fully described in co-pending U.S. patent application No. 09/543,777, entitled, "Composition For Metal CMP With Low Dishing And Overpolish Insensitivity," filed on Apr. 5, 2000, and incorporated herein by reference to the extent not inconsistent with the invention.

The first CMP composition used in the first step of the two step barrier layer material planarizing process may remove the residual copper containing material, or copper containing material residue, and a portion of the barrier layer material from the substrate at a ratio of copper containing material to barrier layer between about 1:1 and about 2:1, thereby having a selectivity to copper containing materials between about 1:1 and about 2:1. A selectivity of the copper containing material to the barrier layer material of about 1:1 is used to ensure that the copper containing material and the barrier layer material are removed at about the same rate.

The first CMP composition may comprise an abrasive-free CMP composition comprising one or more reducing agents, one or more pH adjusting agents, one or more corrosion inhibitors, one or more chelating agents, and deionized water. The reducing agent can be selected from the group of hydroxylamine, glucose, sulfothionate, potassium iodide, and combinations thereof. The reducing agent can be present in an amount between about 0.005 wt. % to about 10 wt. % of the first CMP composition. In one aspect of the invention, a concentration of about 0.1 wt. % of reducing agent is used in the first composition.

The one or more chelating agents may include conventional chelating agents such as iminodiaetic acid or include one or more amine or amide groups, such as ethylenediaminetetraacetic acid, ethylenediamine, or methylformamide, and can include one or more acids, such as oxalic acid and acetic acid. The one or more chelating agents can also include compounds having one or more quinoline groups, such as 8-hydroxyquinoline. The one or more chelating agents can be present in an amount between about 0.005 vol % to about 0.5 vol % of the CMP composition. In one aspect of the invention, the chelating agent comprises about 0.05 wt. % of the composition The pH adjusting agent or agents can be present in an amount sufficient to adjust the pH of the first CMP composition to a range of about 2.5 to about 11 and can comprise any of various bases, such as potassium hydroxide (KOH) or inorganic and/or organic acids, such as acetic acid, phosphoric acid, nitric acid, or oxalic acid.

Examples of corrosion inhibitors that may be included in the first CMP composition may be any various organic compounds containing an azole group, such as benzotriazole, mercaptobenzotriazole, 5-methyl benzotriazole, or 5-methyl-1benzotriazole. The one or more corrosion inhibitors can be present in an amount between about 0.01 vol % to about 0.2 vol % of the CMP composition.

In one aspect of the first CMP composition, abrasives may be added to the first CMP composition to improve polishing of the substrate surface. The CMP composition may contain up to about 5 wt. % of abrasives. One example of a CMP composition having abrasive particles includes a colloidal suspension of silicon oxide particles, with an average size of about 50 nm. Other abrasive components which may be used in CMP compositions include, but are not limited to, alumina, zirconium oxide, titanium oxide, cerium oxide, or any other abrasives known in the art and used in conventional CMP compositions.

An example of the first CMP composition includes between about 0.005 wt. % and about 10 wt. % of a reducing agent, e.g., about 0.1 wt. %., such as hydroxylamine, between about 0.005 wt. % and about 0.5 wt. % e.g., about 0.05 wt. %, of a chelating agent, such as hydroxyquinoline, between about 0.01 wt. % and about 0.2 wt. % corrosion inhibitor, e.g., about 0.05 wt. %, such as 5-methyl benzotriazole, an amount of pH agent, such as acetic acid, to adjust the pH between about 7 and about 10, and the balance being deionized water.

The first CMP composition is believed to remove the residual copper containing material disposed on the barrier layer by oxidizing any copper containing material to produce oxidized copper material, such as Cu ions or copper oxide (CuO), during the CMP process. The oxidized copper containing residue is then mechanically abraded by the polishing pad from the substrate surface and may be entrained in the first CMP composition. The barrier layer material is typically mechanically abraded by the polishing pad from the substrate surface. The chelating agent in the first CMP composition chemically reacts with any metal ions produced during the CMP process to form soluble metal complexes to increase the removal of the copper containing residue from the substrate surface. In this manner, all or substantially all of the residual copper containing material is removed from the surface of the substrate and removal of the barrier layer to the dielectric materials on the substrate surface can be performed.

The second CMP composition used in the second step selectively polishes, i.e., removes, residual barrier layer material at a higher removal rate than removal of the dielectric material disposed adjacent thereto. The second CMP composition used in the second step may remove the barrier layer material and the dielectric material from the substrate at a ratio of barrier layer material to the dielectric material between about 1:0 and about 1:0.2, thereby having a selectivity to barrier layer materials between about 1:0 and about 1:0.2.

The second CMP composition may be selected to polish the barrier layer material at a sufficient selectivity to minimize polishing of the dielectric layer or stop polishing on contact with the dielectric layer as well as reduce dishing in the copper containing features formed in the substrate surface. The barrier layer, the copper containing material and the dielectric layer are removed from the substrate at a ratio of barrier layer to copper containing material to dielectric layer of about 1:0.2:0.2 and about 1:0:0, thereby having a selectivity of about 1:0.2:0.2 and about 1:0:0. A higher barrier layer material removal rate in comparison to the removal rate of the copper containing material and dielectric material has been observed to reduce dishing of the copper containing material and erosion and oxide loss of the dielectric material.

The second CMP composition may comprise an abrasive-free CMP composition, or have a low abrasive particle concentration (i.e., <1.0%), comprising at least one reducing agent for reducing ions of at least one transition metal to a lower valence state, ions of the at least one transition metal, at least one pH adjusting agent for providing the composition with a pH between about 4 and about 12, at least one metal corrosion inhibitor, and water. The composition may further comprise abrasive particles, at least one pH buffering agent, at least one metal chelating agent, or combinations thereof.

Suitable transition metal ions for use in performing selective CMP of barrier layer materials include, but are not limited to, copper (Cu), iron (Fe) ions, and silver (Ag) ions. The ions of the transition metal are either contained in the aqueous liquid composition when the composition is applied to the substrate surface or to the polishing pad, or are introduced into the composition subsequent to the application of the composition to the substrate surface or to the polishing pad. For example, the requisite Cu transition metal ions are formed in situ during polishing of the copper and tantalum layers and then supplied to the composition for use in polishing of the barrier layer materials in the second CMP step. Additionally, copper residue from an earlier processing step still present on the surface of the substrate may be the source of the metal ions. The requisite transitional metal ions may also be supplied to the second composition by contacting a metal disk, such as a copper disk, with the polishing pad, or by addition of a solution of metal ions to the second composition.

The reducing agent can be selected from hydroxylamine, glucose, sulfothionate, potassium iodide, and combinations thereof at a concentration between about 0.005 wt. % to about 10 wt. % of the composition. The at least one pH adjusting agent may be present at a concentration sufficient to provide the composition with a pH between about 4 and about 12, for example a pH between about 8 and about 12 when hydroxylamine is used as the reducing agent in the composition. The metal corrosion inhibitor, typically organic compounds comprising at least one azole group, such as benzotriazo, for moderating metal loss of copper containing materials during the selective CMP, can comprise about 2.0 wt. % or less of the CMP composition.

The composition may, if desired in order to enhance the removal rate, also contain a small amount of abrasive particles, e.g., up to about 10 wt. % of abrasive particles, typically about 0.3 to about 1.0 wt. % of abrasive particles, such as of silica ($SiO_2$), alumina ($Al_2O_3$), or titania ($TiO_2$).

The composition may further include about 0.1 to about 8 wt. % of at least one pH buffering agent, such as an alkali metal bicarbonate and tetraborate-tetrahydrate salts, about 0.01 to about 0.5 wt. % of at least one metal chelating agent comprising, for example, carboxylate and/or amino groups, or combinations thereof to improve polishing performance.

An example of the second CMP composition includes between about between about 0.005 wt. % and about 10 wt. % of hydroxylamine, glucose, sulfothionate, or potassium iodide, a pH adjusting agent at a concentration sufficient to provide a pH between about 8 and about 12, about 2.0 wt. % or less of 5-methyl benzotriazole, and deionized water. The composition further includes between about 0.3 wt. % and about 1.0 wt. % of silica abrasive particle, between about 0.1 wt. % and about 8 wt. % of an alkali metal bicarbonate and tetraborate-tetrahydrate salt as a buffering agent, and between about 0.01 wt. % and about 0.5 wt. % chelating agent having carboxylate and/or amino groups.

The operative mechanism by which the first and second CMP compositions facilitates rapid and selective planarization of tantalum containing barrier layer materials is not known with certainty. However, it is believed that the problems attendant upon CMP of tantalum containing barrier layer materials stem from the chemically inert nature of tantalum and its compounds. Conventional CMP is predicated upon a combination of chemical reaction and mechanical action (abrasion) for material removal. Since tantalum and its related compounds are relatively inert after oxidation, mechanical abrasion is the predominant mechanism for removing tantalum containing barrier layer materials. However, it is believed that the low valence state transition metal ions of the compositions facilitate CMP of the tantalum containing barrier layer materials, even in the absence of abrasive particles.

It is believed that the two-step process reduces dishing of the copper containing material disposed in the feature and on the barrier layer materials during chemical mechanical polishing of the substrate surface when copper containing residue is removed prior to polishing the barrier layer material. The two-step removal process with the second step having an increased selectivity to the barrier layer over the copper containing layer and the dielectric layer is observed to have reduced erosion and reduced dielectric material layer loss, particularly with $SiO_2$ layers and low metal (e.g., Cu) loss at relatively high tantalum removal rates (>750 Å/min.). The process and CMP composition have been observed to produce a good uniformity of planarization on the substrate. Finally, the ability to planarize using an abrasive-free process or a process utilizing a very low concentration of abrasives results in lower production and operation costs.

Moreover, the two-step barrier layer removal process described herein can be performed on a single platen rather than having each step performed on two separate platens. This improves the processing efficiency by increasing the number of steps that can be performed on a polishing apparatus and improve equipment usage by minimizing the need for additional equipment. The process is compatible with the requirements for manufacturing throughput on a large scale, and is fully compatible with all other aspects of conventional polishing technology utilized in the manufacture of high integration density semiconductor devices.

Figure 2:
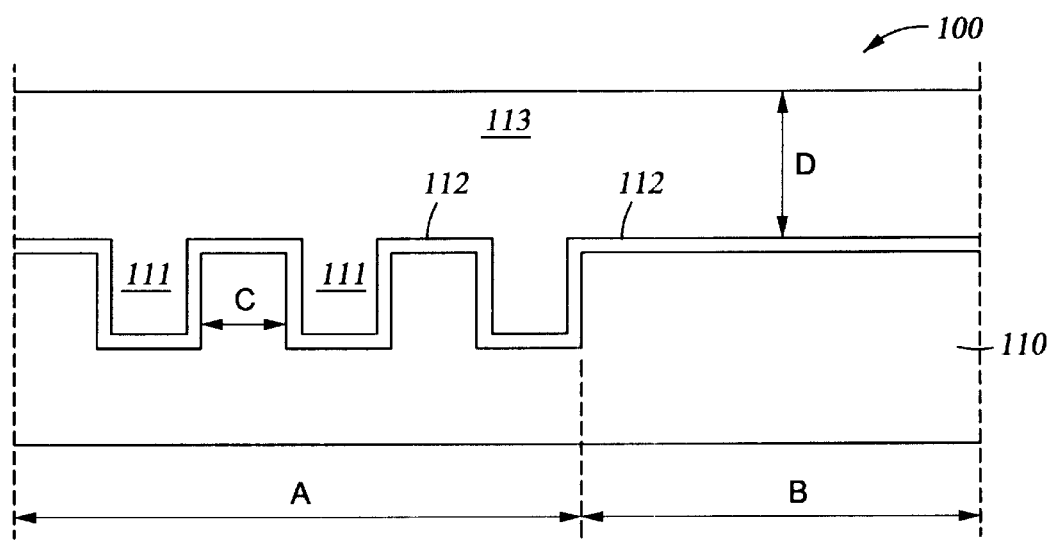
FIGS. 2–4 are schematic diagrams of a substrate illustrating one embodiment of a process for planarizing a substrate surface described herein.
Figure 3:
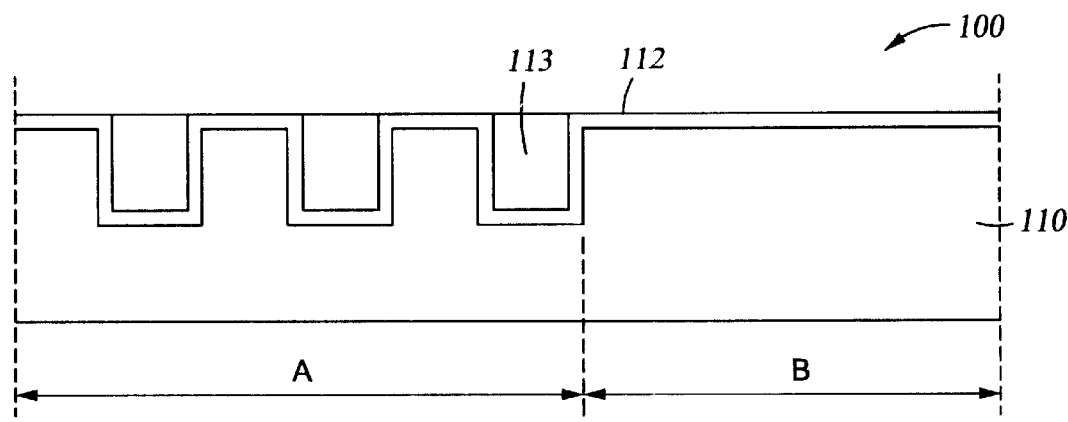
Figure 4:
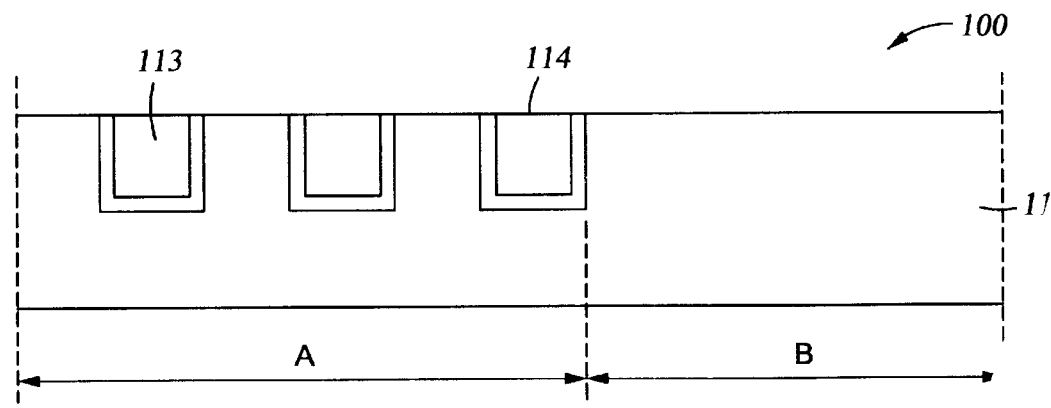
Figure 5:
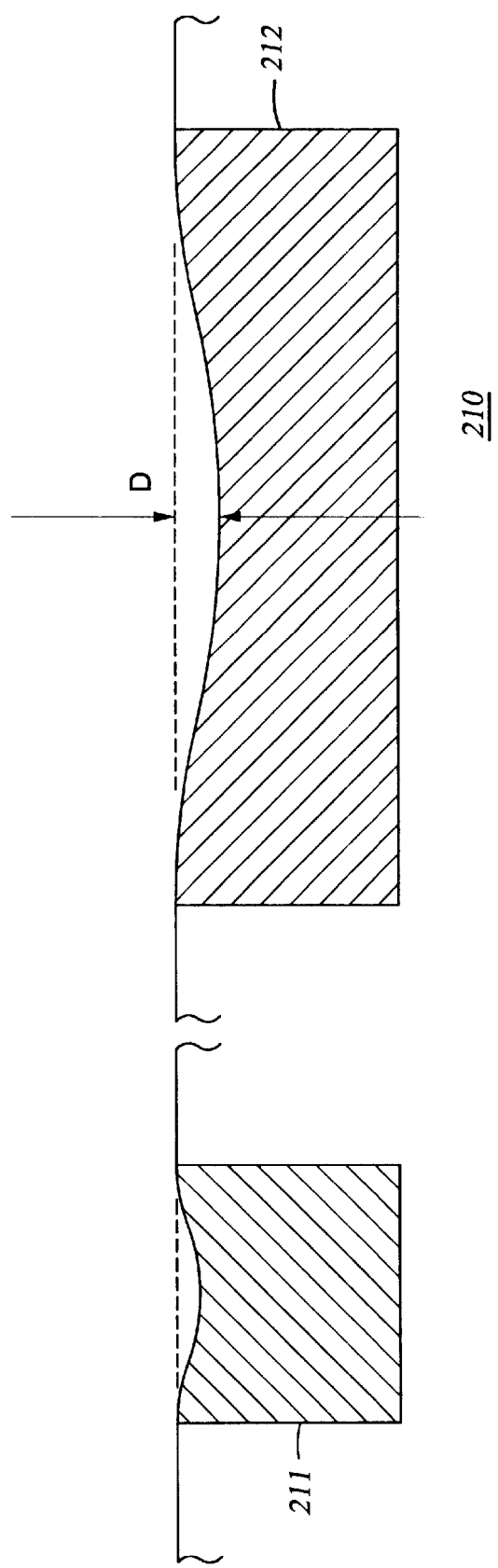
FIG. 5 is a schematic view of a substrate illustrating the phenomenon of dishing.

FIGS. 2–4 are series of schematic cross-sectional views of a substrate illustrating sequential phases of a process for forming an in-laid metallization pattern utilizing the two-step planarization process described herein.

Referring to FIG. 2, the substrate includes a dielectric layer 110, such as a silicon oxide or a carbon-doped silicon oxide, formed on a substrate 100. A plurality of openings 111 patterned and etched into the dielectric in area A forming features for a dense array of conductive lines with area B being unetched. Typically, the openings 111 are spaced apart by a distance C which can be less than about 1 micron, such as about 0.2 micron, or greater than 10 microns, such as 20 microns. The openings 111 were formed in the dielectric layer 110 by conventional photolithographic and etching techniques. A barrier layer 112 of a conductive material, such as Ta or TaN for a copper metallization, is disposed conformally in openings 111 and on the upper surface of the dielectric layer 110. A copper layer 113 is disposed on the barrier layer at a thickness (D) between about 8,000 Å and about 18,000 Å.

Referring to FIG. 3, the bulk of the copper layer 113 is removed using a CMP copper polishing process with the bulk CMP composition described herein. The bulk CMP composition removes the copper layer 113 to the tantalum containing barrier layer 112. Removing the copper material by a bulk CMP composition having a selectivity of about 1:0 between copper and tantalum containing allows for effective removal of the copper layer 113 to the tantalum containing layer 112, minimizes dishing of the copper later 113, and minimizes formation of a non-planar surface.

Referring to FIG. 4, the two step planarization of the barrier layer is performed according to the process and CMP composition disclosed herein. A first composition is used to remove all or substantially all of the residual copper containing material and a portion of the tantalum containing barrier layer 112 from the substrate 100, and a second CMP composition removes the residual tantalum containing barrier layer 112. The second CMP composition typically stops on the dielectric layer to prevent excessive removal of the dielectric material, thereby completing planarization. A first CMP composition having a selectivity of copper to barrier of about 1:1 ensures the removal of the residual copper prior to removal of the residual barrier layer 112. A second CMP composition having a high selectivity to the tantalum containing barrier layer 112 in comparison to the copper layer 113 and the dielectric layer 110 of about 1:0.2:0.2 allows for removal of substantially all of the tantalum containing material while minimizing removal of the dielectric layer 110. However, the dielectric layer 110 may be polished during the second CMP process to remove or reduce scratching or defects formed on the substrate surface. The resulting copper features comprises a dense array (A) of copper lines 113 bordered by open field B and the planar surface 114 of the copper metallization and substrate 100.

EXAMPLE

An example of a two-step polishing process according to aspects of the invention described herein is as follows. A substrate including a low k dielectric layer with feature definitions formed therein, a tantalum containing barrier layer conformally deposited on the low k dielectric layer and in the feature definitions formed therein, and a copper layer deposited on the barrier layer and filling the feature definitions formed therein is provided to the CMP apparatus disclosed above.

The substrate is positioned over a first polishing pad of a first platen, and a bulk CMP composition having a selectivity of about 1:0 between the copper and the tantalum containing layer is delivered to the polishing pad. An example of the bulk CMP composition includes between about 0.2 vol % to about 3.0 vol % ethylenediaminetetraacetic acid, between about 0.5 vol % and about 8.0 vol % hydrogen peroxide, between about 0.02 vol % and about 1.0 vol % benzotriazole, and a pH adjusting to adjust the pH of the CMP composition to a range between about 2.5 and about 11.

The substrate is then transferred to a second polishing pad on a second platen, and a first CMP composition having a selectivity of about 1:0 between the tantalum containing layer and the dielectric material is delivered to the polishing pad. An example of the first CMP composition includes between about 0.005 wt. % and about 10 wt. % of a reducing agent, e.g., about 0.1 wt. %., such as hydroxylamine, between about 0.005 wt. % and about 0.5 wt. % e.g., about 0.05 wt. %, of a chelating agent, such as hydroxyquinoline, between about 0.01 wt. % and about 0.2 wt. % corrosion inhibitor, e.g., about 0.05 wt. %, such as 5-methyl benzotriazole, an amount of pH agent, such as acetic acid, to adjust the pH between about 7 and about 10, and the balance being deionized water. The first CMP composition may also include up to about 5 wt. % of abrasives. The pressure of the polishing pad pressure of between about 1 to about 8 psi. The substrate is then polished for a requisite amount of time sufficient for complete or substantially complete removal of the copper containing material and a portion of the underlying barrier layer.

Then, the second CMP composition having a selectivity of about 10:1:1 of the tantalum containing layer to the copper to the low k dielectric material described herein is delivered to the same polishing pad. An example of the second CMP composition includes between about between about 0.005 wt. % and about 10 wt. % of hydroxylamine, glucose, sulfothionate, or potassium iodide, a pH adjusting agent at a concentration sufficient to provide a pH between about 8 and about 12, about 2.0 wt. % or less of 5-methyl benzotriazole, and deionized water. The composition further includes between about 0.3 wt. % and about 1.0 wt. % of silica abrasive particle, between about 0.1 wt. % and about 8 wt. % of an alkali metal bicarbonate and tetraborate-tetrahydrate salt as a buffering agent, and between about 0.01 wt. % and about 0.5 wt. % chelating agent having carboxylate and/or amino groups. The pressure of the polishing pad pressure of between about 1 to about 8 psi. The substrate is then polished for a requisite amount of time sufficient to remove all or substantially all of the barrier layer to the dielectric layer.

While the foregoing is directed to the one or more embodiments of the invention, other and further embodiments of the invention may be devised without departing from the basic scope thereof, and the scope thereof is determined by the claims that follow including their equivalents.

What is claimed is:

1. A method for planarizing a substrate surface, comprising:

providing a substrate comprising a dielectric layer with feature definitions formed therein, a barrier layer conformally deposited on the dielectric layer and in the feature definitions formed therein, and a copper containing material deposited on the barrier layer and filling the feature definitions formed therein;

chemical mechanical polishing the substrate with a bulk CMP composition to substantially remove excess copper containing materials;

chemical mechanical polishing the substrate with a first CMP composition to remove residual copper containing materials and at least a portion of the barrier layer; and chemical mechanical polishing the substrate with a second CMP composition to selectively remove residual barrier layer.

2. The method of claim 1, wherein the barrier layer comprises tantalum or tantalum nitride.

3. The method of claim 1, wherein the first CMP composition is an abrasive-free chemical mechanical polishing composition comprising:

a) one or more chelating agents;

b) one or more reducing agents;

c) one or more corrosion inhibitors;

d) one or more pH adjusting agents; and e) deionized water.

4. The method of claim 1, wherein the first CMP composition is an abrasive-free chemical mechanical polishing composition comprising:

a) between about 0.005 wt. % and about 0.5 wt. % of hydroxyquinoline as a chelating agent;

b) between about 0.005 wt. % and about 10 wt. % of hydroxylamine as a reducing agent;

c) between about 0.01 wt. % and about 0.20 wt. % of 5-methyl benzotriazole as a corrosion inhibitor;

d) one or more pH adjusting agents to generate a pH between about 7 and about 10; and e) deionized water.

5. The method of claim 1, wherein the second CMP composition removes the barrier layer from the substrate at a ratio of barrier layer to copper containing material to dielectric material between about 1:0:0 and about 1:0.2:0.2.

6. The method of claim 1, wherein the first CMP composition removes the copper containing material and the barrier layer from the substrate at a ratio of copper containing material to barrier layer between about 1:1 and about 2:1.

7. The method of claim 1, wherein the second CMP composition is a chemical mechanical polishing composition comprising:

a) at least one reducing agent for reducing ions of at least one transition metal to a lower valence state, wherein the ions of the at least one transition metal are contained in the composition prior to chemical mechanical polishing of the substrate or are introduced into the composition during chemical mechanical polishing of the substrate;

b) at least one pH adjusting agent for providing the composition a pH between about 4 and about 12;

c) at least one metal corrosion inhibitor; and d) deionized water.

8. The method of claim 7, wherein the second CMP composition further comprises an amount of abrasive particles, at least one pH buffering agent, at least one metal chelating agent, or combinations thereof.

9. The method of claim 1, wherein the second CMP composition comprises:

a) between about 0.005 wt. % and about 10 wt. % of hydroxylamine, glucose, sulfothionate, or potassium iodide as a reducing agent for reducing ions of at least one transition metal to a lower valence state, wherein the ions of the at least one transition metal comprise a material selected from the group of copper (Cu), iron (Fe) ions, silver (Ag) ions, and combinations thereof;

b) a pH adjusting agent at a concentration sufficient to provide a pH between about 8 and about 12;

c) about 2.0 wt. % or less of 5-methyl benzotriazole as a corrosion inhibitor; and d) deionized water.

10. The method of claim 9, wherein the second CMP composition further comprises between about 0.03 wt. % and about 1.0 wt. % of silica abrasive particles, between about 0.1 wt. % and about 8 wt. % of an alkali metal bicarbonate and tetraborate-tetrahydrate salt as a pH buffering agent, between about 0.01 wt. % and about 2.0 wt. % chelating agent having carboxylate and/or amino groups, or combinations thereof.

11. A method for planarizing a substrate surface, comprising:

providing a substrate comprising a dielectric layer with feature definitions formed therein, a barrier layer conformally deposited on the dielectric layer and in the feature definitions formed therein, and a copper containing material deposited on the barrier layer and filling the feature definitions formed therein;

supplying a bulk chemical mechanical polishing composition to the substrate;

removing substantially excess copper containing material at a ratio of copper containing material to barrier layer between about 1:0 and about 1:0.2 by a chemical mechanical polishing technique;

supplying a first chemical mechanical polishing composition to the substrate;

removing residual copper containing material and removing at least a portion of the barrier layer from the substrate at a ratio of copper containing material to barrier layer between about 1:1 and about 2:1 by a chemical mechanical polishing technique;

supplying a second chemical mechanical polishing composition to the substrate; and removing residual barrier layer from the substrate at a ratio of barrier layer to copper containing material to dielectric layer between about 1:0:0 and about 1:0.2:0.2 by a chemical mechanical polishing technique.

12. The method of claim 11, wherein the barrier layer comprises a material selected from the group of tantalum or tantalum nitride.

13. The method of claim 11, wherein first chemical mechanical polishing composition is an abrasive-free chemical mechanical polishing composition comprising:

a) one or more chelating agents;

b) one or more reducing agents;

c) one or more corrosion inhibitors;

d) one or more pH adjusting agents; and e) deionized water.

14. The method of claim 11, wherein the first chemical mechanical polishing composition comprises:

a) between about 0.005 wt. % and about 0.5 wt. % of hydroxyquinoline as a chelating agent;

b) between about 0.005 wt. % and about 10 wt. % of hydroxylamine as a reducing agent;

c) between about 0.01 wt. % and about 0.20 wt. % of 5-methyl benzotriazole as a corrosion inhibitor;

d) one or more pH adjusting agents to generate a pH between about 7 and about 10; and e) deionized water.

15. The method of claim 11, wherein the second chemical mechanical polishing composition comprises:

a) at least one reducing agent for reducing ions of at least one transition metal to a lower valence state, wherein the ions of the at least one transition metal are contained in the composition prior to chemical mechanical polishing of the substrate or are introduced into the composition during chemical mechanical polishing of the substrate;

b) at least one: pH adjusting agent for providing the composition a pH between about 4 and about 12;

c) at least one metal corrosion inhibitor; and d) deionized water.

16. The method of claim 15, wherein the second chemical mechanical polishing composition further comprises an amount of abrasive particles, at least one pH buffering agent, at least one metal chelating agent, or combinations thereof.

17. The method of claim 11, wherein the second chemical mechanical polishing composition comprises:

a) between about 0.005 wt. % and about 10 wt. % of hydroxylamine, glucose, sulfothionate, or potassium iodide as a reducing agent for reducing ions of at least one transition metal to a lower valence state, wherein the ions of the at least one transition metal comprise a material selected from the group of copper (Cu), iron (Fe) ions, silver (Ag) ions, and combinations thereof;

b) a pH adjusting agent at a concentration sufficient to provide a pH between about 8 and about 12;

c) about 2.0 wt. % or less of 5-methyl benzotriazole as a corrosion inhibitor; and d) deionized water.

18. The method of claim 17, wherein the second chemical mechanical polishing composition further comprises between about 0.03 wt. % and about 1.0 wt. % of silica abrasive particles, between about 0.1 wt. % and about 8 wt. % of an alkali metal bicarbonate and tetraborate-tetrahydrate salt as a pH buffering agent, between about 0.01 wt. % and about 2.0 wt. % chelating agent having carboxylate and/or amino groups, or combinations thereof.

19. A method for planarizing a barrier layer comprising a tantalum containing material on a substrate surface, comprising:

chemical mechanical polishing the substrate with an abrasive-free chemical mechanical polishing composition comprising one or more reducing agents to selectively remove copper containing residues and a portion of the tantalum containing material therefrom; and then chemical mechanical polishing the substrate to selectively remove the tantalum containing material therefrom.

20. The method of claim 19, wherein the tantalum containing material comprises tantalum, tantalum nitride, or combinations thereof.

21. The method of claim 19, wherein selectively removing the copper containing residues and the portion of the tantalum containing material comprises removing the copper containing residues and the tantalum containing material from the substrate at a ratio of copper containing residues to tantalum containing material between about 1:1 and about 2:1.

22. The method of claim 19, wherein the abrasive-free chemical mechanical polishing composition further comprises:

one or more chelating agents;

one or more corrosion inhibitors;

one or more pH adjusting agents; and deionized water.

23. The method of claim 19, wherein the copper containing residue comprises copper, doped copper, or copper alloys.

24. The method of claim 19, wherein the polishing the substrate to selectively remove the tantalum containing material comprises polishing the substrate surface using a second chemical mechanical polishing composition comprising:

a) at least one reducing agent for reducing ions of at least one transition metal to a lower valence state, wherein the ions of the at least one transition metal are contained in the second chemical mechanical polishing composition prior to chemical mechanical polishing of the substrate or are introduced into the composition during chemical mechanical polishing of the substrate;

b) at least one pH adjusting agent for providing the composition a pH between about 4 and about 12;

c) at least one metal corrosion inhibitor; and d) deionized water.

25. The method of claim 24, wherein the second chemical mechanical polishing composition further comprises an amount of abrasive particles, at least one pH buffering agent, at least one metal chelating agent, or combinations thereof.

26. The method of claim 19, wherein the abrasive-free chemical mechanical polishing composition comprises:

between about 0.005 wt. % and about 0.5 wt. % of hydroxyqulnoline as a chelating agent;

between about 0.05 wt. % and about 10 wt. % of hydroxylamine as a reducing agent;

between about 0.01 wt. % and about 0.20 wt. % of 5-methyl benzotriazole as a corrosion inhibitor;

one or more pH adjusting agents to generate a pH between about 7 and about 10; and deionized water.

27. The method of claim 19, wherein the chemical mechanical polishing composition comprises:

between about 0.005 wt. % and about 10 wt. % of hydroxylamine, glucose, sulfothionate, or potassium iodide as a reducing agent for reducing ions of at least one transition metal to a lower valence state, wherein the ions of the at least one transition metal comprise a material selected from the group of copper (Cu), iron (Fe) ions, silver (Ag) ions, and combinations thereof, a pH adjusting agent at a concentration sufficient to provide a pH between about 8 and about 12;

about 2.0 wt. % or less of 5-methyl berizotriazole as a corrosion inhibitor; and deionized water.

28. The method of claim 27, wherein the chemical mechanical polishing composition further comprises between about 0.03 wt. % and about 1.0 wt. % of silica abrasive particles, between about 0.1 wt. % and about 8 wt. % of an alkali metal bicarbonate and tetraborate-tetrahydrate salt as a pH buffering agent, between about 0.01 wt. % and about 2.0 wt. % chelating agent having carboxylate and/or amino groups, or combinations thereof.

29. The method of claim 22, wherein the abrasive-free chemical mechanical polishing composition comprises:

a) between about 0.005 wt. % and about 0.5 wt. % of hydroxyquinoline as a chelating agent;

b) between about 0.005 wt. % and about 10 wt. % of hydroxylamine as a reducing agent;

c) between about 0.01 wt. % and about 0.20 wt. % of 5-methyl benzotriazole as a corrosion inhibitor;

d) one or more pH adjusting agents to generate a pH between about 7 and about 10; and e) deionized water.

30. The method of claim 29, wherein the tantalum containing material comprises tantalum, tantalum nitride, or combinations thereof, and the copper containing residue comprises copper, doped copper, or copper alloys.

31. The method of claim 29, wherein selectively removing the copper containing residues and the portion of the tantalum containing material comprises removing the copper containing residues and the tantalum containing material from the substrate at a ratio of copper containing residues to tantalum containing material between about 1:1 and about 2:1, and wherein selectively removing the tantalum containing material comprises removing the tantalum containing material and the copper containing residues from the substrate at a ratio of tantalum containing material to copper containing residues to dielectric material between about 1:0:0 and about 1:0.2:0.2.

32. The method of claim 29, wherein the polishing the substrate to selectively remove the tantalum containing material comprises polishing the substrate surface using a second chemical mechanical polishing composition comprising:

a) at least one reducing agent for reducing ions of at least one transition metal to a lower valence state, wherein the ions of the at least one transition metal are contained in the second chemical mechanical polishing composition prior to chemical mechanical polishing of the substrate or are introduced into the composition during chemical mechanical polishing of the substrate;

b) at least one pH adjusting agent for providing the composition a pH between about 4 and about 12;

c) at least one metal corrosion inhibitor; and d) deionized water.

33. The method of claim 32, wherein the second chemical mechanical polishing composition further comprises an amount of abrasive particles, at least one pH buffering agent, at least one metal chelating agent, or combinations thereof.

34. The method of claim 19, wherein the chemical mechanical polishing composition comprises:

a) between about 0.005 wt. % and about 10 wt. % of hydroxylamine, glucose, sulfothionate, or potassium iodide as a reducing agent for reducing ions of at least one transition metal to a lower valence state, wherein the ions of the at least one transition metal comprise a material selected from the group of copper (Cu), iron (Fe) ions, silver (Ag) ions, and combinations thereof;

b) a pH adjusting agent at a concentration sufficient to provide a pH between about 8 and about 12;

c) about 2.0 wt. % or less of 5-methyl benzotriazole as a corrosion inhibitor; and d) deionized water.

35. The method of claim 34, wherein the chemical mechanical polishing composition further comprises between about 0.03 wt. % and about 1.0 wt. % of silica abrasive particles, between about 0.1 wt. % and about 8 wt. % of an alkali metal bicarbonate and tetraborate-tetrahydrate salt as a pH buffering agent, between about 0.01 wt. % and about 2.0 wt. % chelating agent having carboxylate and/or amino groups, or combinations thereof.

36. The method of claim 34, wherein the tantalum containing material comprises tantalum, tantalum nitride, or combinations thereof, and the copper containing residue comprises copper, doped copper, or copper alloys.

37. The method of claim 34, wherein selectively removing the copper containing residues and the portion of the tantalum containing material comprises removing the copper containing residues and the tantalum containing material from the substrate at a ratio of copper containing residues to tantalum containing material between about 1:1 and about 2:1, and wherein selectively removing the tantalum containing material comprises removing the tantalum containing material and the copper containing residues from the substrate at a ratio of tantalum containing material to copper containing residues to dielectric material between about 1:0:0 and about 1:0.2:0.2.

38. The method of claim 34, wherein the polishing the substrate to selectively remove the tantalum containing material comprises polishing the substrate surface using a second chemical mechanical polishing composition comprising:

a) at least one reducing agent for reducing Ions of at least one transition metal to a lower valence state, wherein the ions of the at least one transition metal are contained in the second chemical mechanical polishing composition prior to chemical mechanical polishing of the substrate or are introduced into the composition during chemical mechanical polishing of the substrate;

b) at least one pH adjusting agent for providing the composition a pH between about 4 and about 12;

c) at least one metal corrosion inhibitor; and d) deionized water.

39. The method of claim 38, wherein the second chemical mechanical polishing composition further comprises an amount of abrasive particles, at least one pH buffering agent, at least one metal chelating agent, or combinations thereof.

40. A method for planarizing a barrier layer comprising a tantalum containing material on a substrate surface, comprising:

chemical mechanical polishing the substrate to selectively remove copper containing residues and a portion of the tantalum containing material therefrom; and then chemical mechanical polishing the substrate to selectively remove the tantalum containing material therefrom, wherein selectively removing the tantalum containing material comprises removing the tantalum containing material and the copper containing residues from the substrate at a ratio of tantalum containing material to copper containing residues to dielectric material between about 1:0:0 and about 1:0.2:0.2.

41. The method of claim 40, wherein the tantalum containing material comprises tantalum, tantalum nitride, or combinations thereof, and the copper containing residue comprises copper, doped copper, or copper alloys.

42. The method of claim 40, wherein selectively removing the copper containing residues and the portion of the tantalum containing material comprises removing the copper containing residues and the tantalum containing material from the substrate at a ratio of copper containing residues to tantalum containing material between about 1:1 and about 2:1.

43. The method of claim 40, wherein the copper containing residue and the tantalum containing material are removed from the substrate using an abrasive-free first chemical mechanical polishing composition comprising:

a) one or more chelating agents;

b) one or more reducing agents;

c) one or more corrosion inhibitors;

d) one or more pH adjusting agents; and e) deionized water.

44. The method of claim 43, wherein the abrasive-free first chemical mechanical polishing composition comprises:

a) between about 0.005 wt. % and about 0.5 wt. % of hydroxyquinoline as, a chelating agent;

b) between about 0.005 wt. % and about 10 wt. % of hydroxylamine as a reducing agent;

c) between about 0.01 wt. % and about 0.20 wt. % of 5-methyl benzotriazole as a corrosion inhibitor;

d) one or more pH adjusting agents to generate a pH between about 7 and about 10; and e) deionized water.

45. The method of claim 40, wherein the polishing the substrate to selectively remove the tantalum containing material comprises polishing the substrate surface using a second chemical mechanical polishing composition comprising:

a) at least one reducing agent for reducing ions of at least one transition metal to a lower valence state, wherein the ions of the at least one transition metal are contained in the second chemical mechanical polishing composition prior to chemical mechanical polishing of the substrate or are introduced into the composition during chemical mechanical polishing of the substrate;

b) at least one pH adjusting agent for providing the composition a pH between about 4 and about 12;

c) at least one metal corrosion inhibitor; and d) deionized water.

46. The method of claim 45, wherein the second chemical mechanical polishing composition further comprises an amount of abrasive particles, at least one pH buffering agent, at least one metal chelating agent, or combinations thereof.

47. The method of claim 45, wherein the second chemical mechanical polishing composition comprises:

a) between about 0.005 wt. % and about 10 wt. % of hydroxylamine, glucose, sulfothionate, or potassium iodide as a reducing agent for reducing ions of at least one transition metal to a lower valence state, wherein the ions of the at least one transition metal comprise a material selected from the group of copper (Cu), iron (Fe) ions, silver (Ag) ions, and combinations thereof;
b) a pH adjusting agent at a concentration sufficient to provide a pH between about 8 and about 12;
c) about 2.0 wt. % or less of 5-methyl benzotriazole as a corrosion inhibitor; and
d) deionized water.

48. The method of claim 47, wherein the second chemical mechanical polishing composition further comprises between about 0.03 wt. % and about 1.0 wt. % of silica abrasive particles, between about 0.1 wt. % and about 8 wt. % of an alkali metal bicarbonate and tetraborate-tetrahydrate salt as a pH buffering agent, between about 0.01 wt. % and about 2.0 wt. % chelating agent having carboxylate and/or amino groups, or combinations thereof.

49. A method for planarizing a barrier layer comprising a tantalum containing material on a substrate surface, comprising:
chemical mechanical polishing the substrate to selectively remove copper containing residues and a portion of the tantalum containing material therefrom; and then
chemical mechanical polishing the substrate to selectively remove the tantalum containing material therefrom, wherein chemically mechanical polishing the substrate comprises the application of a chemical mechanical polishing composition comprising:
between about 0.005 wt. % and about 10 wt. % of hydroxylamine, glucose, sulfothionate, or potassium iodide as a reducing agent for reducing ions of at least one transition metal to a lower valence state, wherein the ions of the at least one transition metal comprise a material selected from the group of copper (Cu), iron (Fe) ions, silver (Ag) ions, and combinations thereof;
a pH adjusting agent at a concentration sufficient to provide a pH between about 8 and about 12;
about 2.0 wt. % or less of 5-methyl benzotriazole as a corrosion inhibitor; and
deionized water.

50. The method of claim 49, wherein the chemical mechanical polishing composition further comprises between about 0.03 wt. % and about 1.0 wt. % of silica abrasive particles, between about 0.1 wt. % and about 8 wt. % of an alkali metal bicarbonate and tetraborate-tetrahydrate salt as a pH buffering agent, between about 0.01 wt. % and about 2.0 wt. % chelating agent having carboxylate and/or amino groups, or combinations thereof.

51. The method of claim 49, wherein the tantalum containing material comprises tantalum, tantalum nitride, or combinations thereof, and the copper containing residue comprises copper, doped copper, or copper alloys.

52. The method of claims 49, wherein selectively removing the copper containing residues and the portion of the tantalum containing material comprises removing the copper containing residues and the tantalum containing material from the substrate at a ratio of copper containing residues to tantalum containing material between about 1:1 and about 2:1.

53. The method of claim 49, wherein selectively removing the tantalum containing material comprises removing the tantalum containing material and the copper containing residues from the substrate at a ratio of tantalum containing material to copper containing residues to dielectric material between about 1:0:0 and about 1:0.2:0.2.

54. The method of claim 49, wherein the copper containing residue and the tantalum containing material are removed from the substrate using an abrasive-free chemical mechanical polishing composition comprising:
one or more chelating agents;
one or more reducing agents;
one or more corrosion inhibitors;
one or more pH adjusting agents; and
deionized water.

55. The method of claim 54, wherein the abrasive-free chemical mechanical polishing composition comprises:
a) between about 0.005 wt. % and about 0.5 wt. % of hydroxyquinoline as a chelating agent;
b) between abet 0.005 wt. % and about 10 wt. % of hydroxylamine as a reducing agent;
c) between about 0.01 wt. % and about 0.20 wt. % of 5-methyl benzotriazole as a corrosion inhibitor;
d) one or more pH adjusting agents to generate a pH between about 7 and about 10; and
e) deionized water.

* * * * *